US008250517B2

(12) United States Patent
Falbo et al.

(10) Patent No.: US 8,250,517 B2
(45) Date of Patent: Aug. 21, 2012

(54) SHAPE-BASED GEOMETRY ENGINE TO PERFORM SMOOTHING AND OTHER LAYOUT BEAUTIFICATION OPERATIONS

(75) Inventors: James K. Falbo, San Jose, CA (US); Vinod K. Malhotra, San Jose, CA (US); Pratheep Balasingam, San Jose, CA (US); Donald Zulch, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 267 days.

(21) Appl. No.: 12/687,080

(22) Filed: Jan. 13, 2010

(65) Prior Publication Data
US 2010/0115481 A1 May 6, 2010

Related U.S. Application Data

(63) Continuation of application No. 11/610,490, filed on Dec. 13, 2006, now Pat. No. 7,669,169, which is a continuation of application No. 10/040,055, filed on Dec. 31, 2001, now Pat. No. 7,159,197.

(51) Int. Cl.
*G06F 17/50* (2006.01)

(52) U.S. Cl. .............. 716/139; 716/50; 716/51; 716/52; 716/53; 716/54; 716/55; 716/132; 716/136

(58) Field of Classification Search .............. 716/50–55, 716/110, 111, 112, 132, 136, 139
See application file for complete search history.

(56) References Cited

U.S. PATENT DOCUMENTS

| | | | |
|---|---|---|---|
| 4,895,780 A | 1/1990 | Nissan-Cohen et al. | 430/5 |
| 5,182,718 A | 1/1993 | Harafuji et al. | 364/490 |
| 5,208,124 A | 5/1993 | Sporon-Fiedler et al. | 430/5 |
| 5,340,700 A | 8/1994 | Chen et al. | 430/312 |
| 5,432,714 A | 7/1995 | Chung et al. | 364/525 |
| 5,533,148 A | 7/1996 | Sayah et al. | 382/240 |
| 5,538,815 A | 7/1996 | Oi et al. | 430/5 |
| 5,553,273 A | 9/1996 | Liebmann | 395/500 |
| 5,553,274 A | 9/1996 | Liebmann | 395/500 |

(Continued)

FOREIGN PATENT DOCUMENTS

GB     2.344.436 A     6/2000

(Continued)

OTHER PUBLICATIONS

McDonald et al.: "Smallest Paths in Simple Rectilinear Polygons", IEEE Transactions on Computer-Aided Design, vol. 11, No. 7, Jul. 1992, pp. 864-875.

(Continued)

*Primary Examiner* — Helen Rossoshek
(74) *Attorney, Agent, or Firm* — Bever, Hoffman & Harms, LLP; Jeanette S. Harms

(57) ABSTRACT

A shape-based layout beautification operation can be performed on an IC layout to correct layout imperfections. A shape is described by edges (and vertices) related according to specified properties. Each shape can be configured to match specific layout imperfection types. Corrective actions can then be associated with the shapes, advantageously enabling efficient formulation and precise application of those corrective actions. Corrective actions can include absolute, adaptive, or replacement-type modifications to the detected layout imperfections. A concurrent processing methodology can be used to minimize processing overhead during layout beautification, and the actions can also be incorporated into a lookup table to further reduce runtime. A layout beautification system can also be connected to a network across which shapes, actions, and IC layout data files can be accessed and retrieved.

15 Claims, 15 Drawing Sheets

U.S. PATENT DOCUMENTS

| | | | |
|---|---|---|---|
| 5,578,409 | A | 11/1996 | Kotaki et al. |
| 5,657,235 | A | 8/1997 | Liebmann et al. ........ 364/474.24 |
| 5,663,017 | A | 9/1997 | Schinella et al. ................ 430/5 |
| 5,663,893 | A | 9/1997 | Wampler et al. ............... 364/491 |
| 5,682,323 | A | 10/1997 | Pasch et al. .................... 364/491 |
| 5,705,301 | A | 1/1998 | Garza et al. ........................ 430/5 |
| 5,707,765 | A | 1/1998 | Chen ................................. 430/5 |
| 5,740,068 | A | 4/1998 | Liebmann et al. ............. 364/489 |
| 5,885,734 | A | 3/1999 | Pierrat et al. ...................... 430/5 |
| 6,009,250 | A | 12/1999 | Ho et al. .................. 395/500.06 |
| 6,009,251 | A | 12/1999 | Ho et al. .................. 395/500.06 |
| 6,011,911 | A | 1/2000 | Ho et al. .................. 395/500.06 |
| 6,064,806 | A | 5/2000 | Lakos et al. ............. 395/500.04 |
| 6,077,310 | A | 6/2000 | Yamamoto et al. .............. 716/19 |
| 6,081,658 | A | 6/2000 | Rieger et al. ............. 395/500.22 |
| 6,128,767 | A | 10/2000 | Chapman |
| 6,249,904 | B1 | 6/2001 | Cobb |
| 6,263,299 | B1 | 7/2001 | Aleshin et al. |
| 6,285,488 | B1 | 9/2001 | Sandstrom |
| 6,303,253 | B1 | 10/2001 | Lu |
| 6,309,809 | B1 | 10/2001 | Starikov et al. |
| 6,370,679 | B1 | 4/2002 | Chang et al. ..................... 716/19 |
| 6,523,162 | B1 | 2/2003 | Agrawal et al. |
| 6,544,699 | B1 | 4/2003 | Kim et al. |
| 6,721,938 | B2 | 4/2004 | Pierrat et al. |
| 7,302,001 | B2 | 11/2007 | Wang et al. ...................... 716/21 |
| 7,487,490 | B2 | 2/2009 | Zhang et al. |
| 2002/0010904 | A1 | 1/2002 | Ayres ............................... 716/19 |
| 2002/0016948 | A1 | 2/2002 | Rein et al. |
| 2003/0014732 | A1 | 1/2003 | Liu et al. |
| 2003/0046653 | A1 | 3/2003 | Liu |

FOREIGN PATENT DOCUMENTS

| | | |
|---|---|---|
| JP | 3-80525 | 4/1991 |
| JP | 07230492 A | 8/1995 |
| WO | WO 97/38381 | 10/1997 |
| WO | WO 99/14636 A1 | 3/1999 |
| WO | WO 99/14637 A1 | 3/1999 |
| WO | WO 99/14638 A1 | 3/1999 |
| WO | WO 02/29491 A1 | 4/2002 |

OTHER PUBLICATIONS

Lithas, "Lithas: Optical Proximity Correction Software" (2 pages), Jan. 13, 2010.

Microunity, "OPC Technology & Product Description", MicroUnity Systems Engineering, Inc., pp. 1-5, Jan. 13, 2010.

Rieger, M.. et al., "Using Behavior Modeling for Proximity Correction", Precim Company, Portland, Oregon (6 pages), Jan. 13, 2010.

Trans Vector. "Now Better Quality Photomasks", Trans Vector Technologies. Inc., Camarillo, California (4 pages), Jan. 13, 2010.

Lin, B.J., "Methods to Print Optical Images at Low-kl Factors". SPIE, Optical/Laser Microlithography III, vol. 1264, pp. 2-13 (1990).

Harafuji, K., et al., "A Novel Hierarchical Approach for Proximity Effect Correction in Electron Beam Lithography", IEEE, vol. 12, No. 10. pp. 1508-1514, Oct. 1993.

Rieger, M.. et al., "System for Lithography Proximity Compensation", Precim Company, Portland. Oregon, Sep. 1993 (28 pages).

Galan, G., et al., "Application of Alternating-Type Phase Shift Mask to Polysilicon Level for Random Logic Circuits", Jpn. J. Appl. Phys.. vol. 33. pp. 6779-6784 (1994).

Garofalo. J., et al., "Automatic Proximity Correction for 0.35um I-Line Photolithography". IEEE. pp. 92-94 (1994).

Pierrat, C., et al., "A Rule-Based Approach to E-Beam and Process-Induced Proximity Effect Correction for Phase-Shifting Mask Fabrication", SPIE. vol. 2194. pp. 298-309 (1994).

Henderson. R., et al., "Optical Proximity Effect Correction: An Emerging Technology", Microlithography World. pp. 6-12 (1994).

Rieger, M.. et al., "Customizing Proximity Correction for Process-Specitic Objectives", SPIE. vol. 2726. pp. 651-659 (1996).

Yen, A.. et al., "Optical Proximity Correction for 0.3um i-line Lithography". Microelectronic Engineering, vol. 30. pp. 141-144. Jan. 1996.

Chen, J.F., et al., "Full-Chip Optical Proximity Correction with Depth of Focus Enhancement". Microlithography World (5 pages) (1997).

Tsujimoto, F.., et al., "Hierarchical Mask Data Design System (PROPHET) for Aerial Image Simulation, Automatic Phase-Shifter Placement. and Subpeak Overlap Checking", SPIE, vol. 3096, pp. 163-172 (1997).

Yamamoto, K., et al., "Hierarchical Processing of Levenson-Type Phase Shifter Generation", Jpn. J. Appl. Phys., vol. 36, Part 1, No. 12B, pp. 7499-7503, Dec. 1997.

Chuang, H., et al., "Practical Applications of 2-D Optical Proximity Corrections for Enhanced Performance of 0.25um Random Logic Devices", IEEE, pp. 18.7.1-18.7.4, Dec. 1997.

Wong, A., et al.. "Asymmetric Biasing for Subgrid Pattern Adjustment", SPIE, vol. 4346, pp. 1-6 (2001).

SHAPE-BASED GEOMETRY ENGINE TO PERFORM SMOOTHING AND OTHER LAYOUT BEAUTIFICATION OPERATIONS

RELATED APPLICATIONS

This application is a continuation of U.S. patent application Ser. No. 11/610,490, entitled "Shape-Based Geometry Engine To Perform Smoothing And Other Layout Beautification Operations" filed Dec. 13, 2006, which issued as U.S. Pat. No. 7,669,169 on Feb. 23, 2010, which is a continuation of U.S. patent application Ser. No. 10/040,055, entitled "Shape-Based Geometry Engine To Perform Smoothing And Other Layout Beautification Operations" filed Dec. 31, 2001, which issued as U.S. Pat. No. 7,159,197 on Jan. 2, 2007.

FIELD OF THE INVENTION

The invention relates to the field of integrated circuit layouts, and more particularly to a system for removing imperfections from an integrated circuit layout.

BACKGROUND OF THE INVENTION

An integrated circuit (IC) is typically made up of many interconnected devices (e.g., transistors) formed on a silicon substrate. The layout of these devices and the manner in which they are interconnected determines the functionality of the IC. As modern ICs become ever more complex, automated design tools have become an essential part of the IC layout development process.

Automated design tools can be used to perform various operations on an IC layout. For example, an automated tool might be used to make optical proximity correction (OPC) modifications or perform design rule checking (DRC) on an IC layout. An automated tool could even be used to create the actual IC layout from a design netlist.

However, while automated tools enable the accurate creation of IC layouts, the complex interactions of the rules embodied in those tools can result in layout imperfections. In other words, while the results of an automated tool may be electrically correct (and even optically correct), the polygons that make up the actual IC layout might include unintended irregularities. These "layout imperfections" are not necessarily defects in the sense that the IC layout may still be electrically correct. However, these layout imperfections may adversely affect layout printability or device performance. Also, such imperfections can significantly increase data volume for a particular IC layout, thereby undesirably increasing layout processing (e.g., OPC, DRC, etc.) and mask production times.

For example, FIG. 1a shows a simple polygon 100 made up of edges 101-108. Polygon 100 could represent a simple wire or interconnect in an IC layout. A notch 111 in the side of polygon 100 represents a common type of layout imperfection. If notch 111 is small, it may cause no significant electrical or optical problems. However, as shown in FIG. 1b, during a fracturing operation notch 111 causes polygon 100 to be split into primitives 121, 122, and 123, along fracture lines 131 and 132. In contrast, FIG. 1c shows a polygon 140 that is substantially similar to polygon 100, but does not have the same notch-type imperfection. As a result, polygon 100 would fracture into a single primitive. Thus, the small imperfection in polygon 100 (i.e., notch 111 shown in FIG. 1b) results in a three-fold increase in data volume after a fracturing operation.

Unfortunately, due to the complexity of modern IC layouts, detecting and correcting this type of layout imperfection (a technique sometimes referred to as "layout beautification") can be difficult. A method sometimes used to eliminate notch-type imperfections involves applying an oversizing/undersizing technique to entire polygons using a DRC tool. As indicated in FIG. 1d, each edge of polygon 100 is biased outward (oversized). As this biasing takes place, notch 111 formed by edges 102-104 shrinks and eventually disappears. The remaining edges can then be biased inward (undersized) to create a corrected (un-notched) polygon having the same overall dimensions as the original polygon 100.

However, this technique of oversizing and undersizing provides a very limited solution to the problem of layout imperfections. Because the manipulations are applied to the entire polygon, specific layout imperfections cannot be targeted and unintended (undesirable) modifications can occur. Furthermore, this technique can only work on certain very simple layout imperfections. Layout imperfections that are even marginally more complex cannot be corrected in this manner.

Therefore, due to these difficulties in detection and correction, layout imperfections are often ignored. Consequently, layout data file sizes are unnecessarily large and processing of those data files (e.g., OPC, DRC, etc.) is unnecessarily time-consuming. Furthermore, the excess of layout imperfections in conventional layouts also can cause problems during mask production by increasing the complexity of the mask-writing process (i.e., the creation of the mask pattern on the mask substrate). This not only slows manufacturing throughput, but also increases the chances of errors during mask production. Accordingly, it is desirable to provide a method for efficiently, effectively, and flexibly performing layout beautification.

SUMMARY OF THE INVENTION

The present invention provides a system for efficiently performing layout beautification on an IC layout (or a portion of an IC layout). In accordance with an embodiment of the invention, a layout beautification system uses a shape-based identification algorithm. A shape is defined as a set of associated edges and vertices, and therefore can provide much greater control and flexibility in identifying and correcting layout imperfections than can the conventional sizing up or down of the layout edges. A set of shapes can be defined and various corrective actions can be associated with those shapes. Shapes can include various contiguous edge profiles, such as notches, bulges, reverse hammerheads, and stair-steps, among others. Shapes can also include non-contiguous edge combinations, edges from multiple layers of an IC layout, and edges with specific properties.

Actions can be specified according to whatever modifications are desired by the user. According to an embodiment of the invention, actions can include absolute modifications in which a fixed-value adjustment is made to the detected layout imperfection. According to another embodiment of the invention, actions can include adaptive modifications, in which the actual adjustment depends on the actual characteristics of the detected layout imperfection. According to another embodiment of the invention, actions can comprise replacing the detected layout imperfection with a replacement shape.

In accordance with an embodiment of the invention, a shape-based layout beautification system can use a sequential processing algorithm. In accordance with another embodiment of the invention, a shape-based layout beautification system can use a concurrent processing algorithm, in which the entire set of shape-based actions are applied to an IC layout polygon in a single pass. The IC layout is therefore scanned just once, and the overhead associated with sequential processing due to the passing back and forth of intermediate layout data can be eliminated.

In accordance with another embodiment of the invention, the set of actions for a concurrent processing layout beautification system can be compiled in a look up table (LUT). A LUT is typically used to reduce processing times for applications involving the selection of a particular item from a large set of options. Because a table lookup can generally be performed substantially faster than a linear search for the applicable action, use of a LUT significantly reduces the total time required for layout beautification over conventional systems.

According to an embodiment of the invention, a layout beautification system includes an input data manager for receiving a layout data file, a layout beautification engine for applying the actions to the layout, and an output data manager for generating the corrected layout data file. In an embodiment of the invention, layout data files, shapes, and actions can be stored and accessed across a network, such as a LAN or a WAN. According to another embodiment of the invention, the input data manager can process and structure the layout data file for optimal processing by the layout beautification engine.

The invention will be more fully understood in view of the following description and drawings.

DETAILED DESCRIPTION

An embodiment of the invention provides a system and method for performing layout beautification on an IC layout using a shape-based approach. The shape-based approach advantageously enables accurate and efficient identification and correction of undesirable layout imperfections.

Shape Definition

Figure 2A:
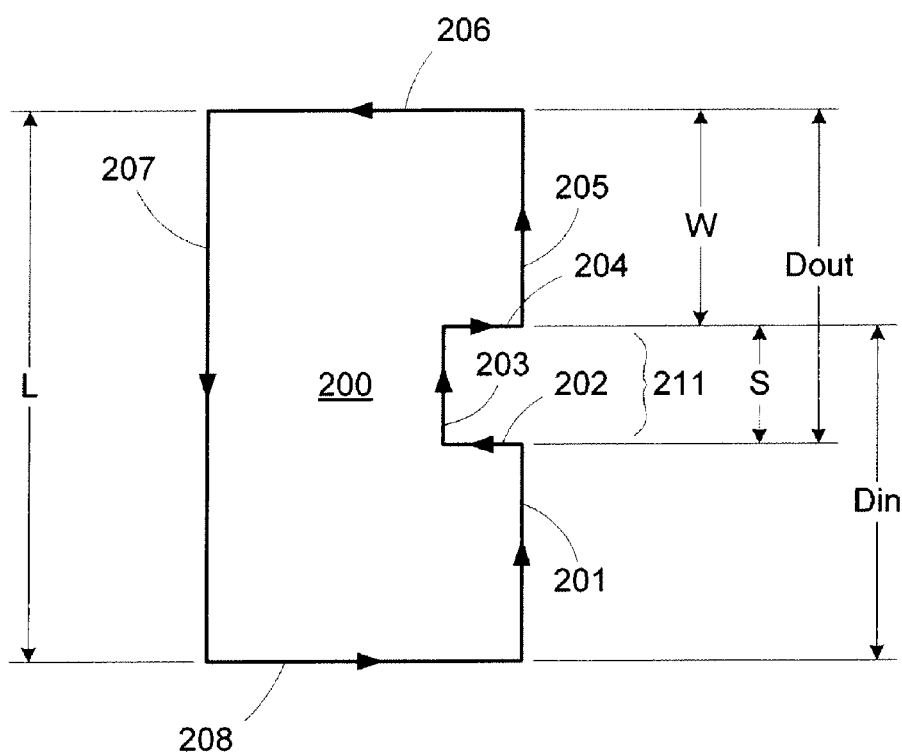
FIGS. 2a and 2b illustrate example shapes that could be used in layout beautification operations.

In accordance with embodiments of the invention, "shapes" can be defined as groupings of associated directed edges and vertices (i.e., points at which two directed edges meet). The direction of an edge determines which side (left or right) of the edge faces the inside or outside of the shape. For example, FIG. 2a shows a sample shape 200 that comprises a series of directed edges 201-208. Shape 200 has a substantially rectangular outline, with edges 202-204 forming a small notch 211 in one side of shape 200. The counter-clockwise direction of edges 201-208 means that the left sides of edges 201, 203, and 205 face the inside of shape 200.

Each shape represents a type of feature (or range of features) that may be present in an IC layout. A set of shape properties defines the relationships between the edges and vertices that make up the shape. Example properties in accordance with various embodiments of the invention include the following:

Color—A tagging mechanism to differentiate one IC layout (or a portion of it) from another, based on certain attributes. For example, the polysilicon layer can be assigned one color whereas the diffusion layer can be assigned another color. Furthermore, the inside of a shape can have one color ("inner color") while the outside of a shape can have a different color ("outer color").

Width—The orthogonal distance between two inside facing edges. For example, in FIG. 2a, edges 204 and 206 have a width W. If the orthogonal distance between the edges varies, both a "minimum width" and a "maximum width" can be defined.

Neighbor Width—The width of the immediate neighboring feature facing an outside edge. For example, in FIG. 2a, the neighbor width for edge 202 is 'W', the distance between edges 204 and 206.

Spacing—The orthogonal distance between two outside facing edges. For example, in FIG. 2a, edges 202 and 204 have a spacing S. If the orthogonal distance between the edges varies, both a "minimum spacing" and a "maximum spacing" can be defined.

Radial Spacing—The radial distance between two outside facing edges. If the radial distance between the edges varies, both a "minimum radial spacing" and a "maximum radial spacing" can be determined.

Angle—The angle at which two connected edges meet. For example, in FIG. 2a, edges 201 and 202 meet at an angle of 270 degrees. Similarly, edges 202 and 203 meet at an angle of 90 degrees.

Length—An edge property that represents the length of the edge. For example, in FIG. 2a, edge 207 has a length L.

Inner Distance—The distance from the inside facing edge of one feature to the outside facing edge of another feature. For example, in FIG. 2a, edge 208 has an inner distance Din from edge 204. If the distance between the edges varies, both a "minimum inner distance" and a "maximum inner distance" can be defined.

Outer Distance—The distance from the outside facing edge of one shape to the inside facing edge of another shape.

For example, in FIG. 2a, edge 202 has an outer distance Dout from edge 206. If the distance between the edges varies, both a "minimum outer distance" and a "maximum outer distance" can be defined. Note that this listing is intended to be exemplary rather than comprehensive. Other properties will be readily apparent.

Figure 1A:
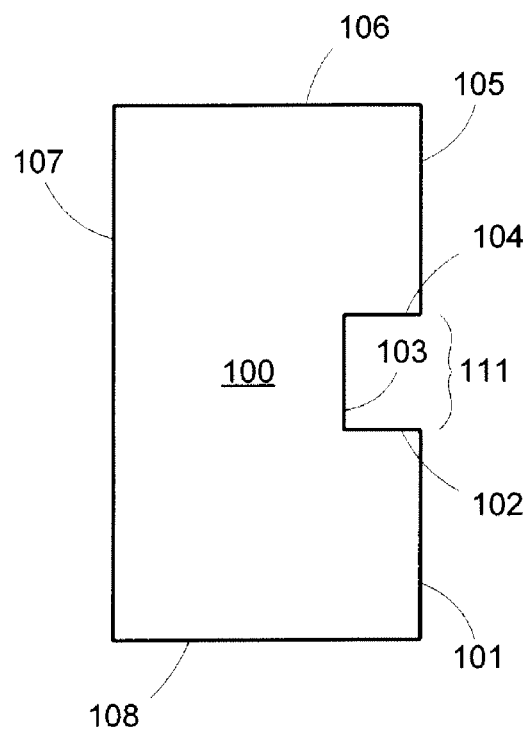
FIGS. 1a-1d show an example layout imperfection (notch) and a conventional method of correcting such a layout imperfection.
Figure 1B:
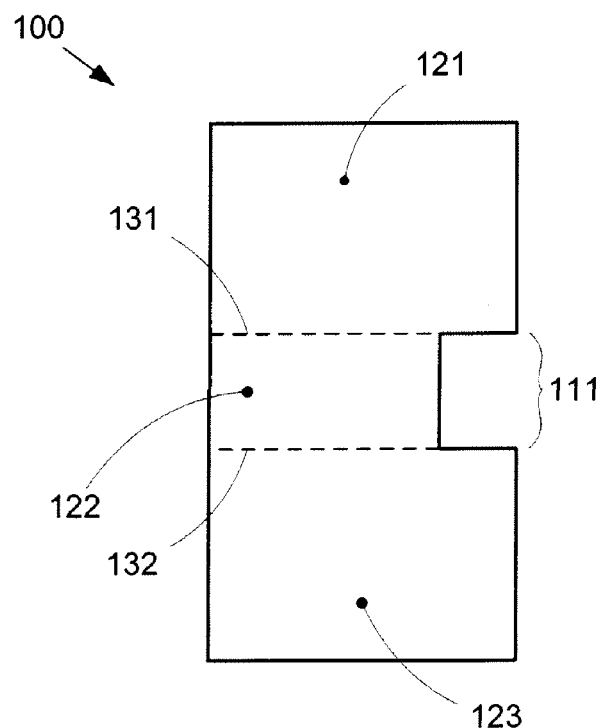
Figure 1C:
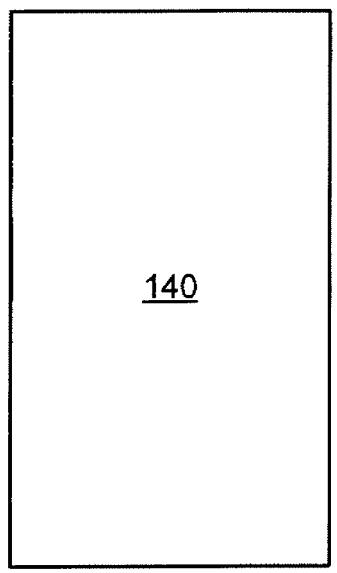
Figure 1D:
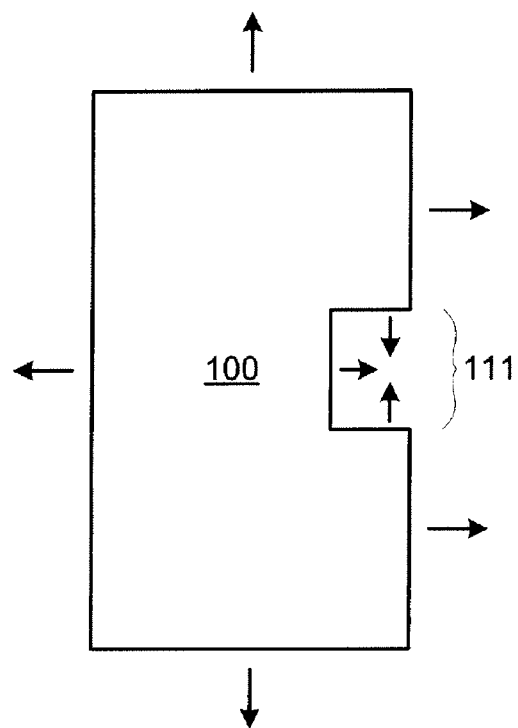

Shape 200 shown in FIG. 2a could be used to identify certain layout elements (groupings of edges), such as polygon 100 shown in FIG. 1a, with edges 201-208 of shape 200 corresponding to edges 101-108, respectively, of polygon 100. However, note that the identification capabilities of shape 200 are limited to substantially rectangular polygons that have a notch-type defect along one side. While this degree of specificity may be desirable in certain situations, in other situations a shape capable of matching a broader range of layout elements may be preferable.

Figure 2B:
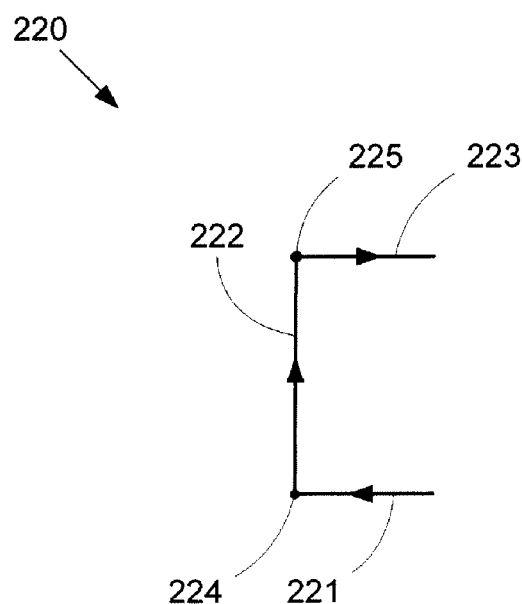

For example, FIG. 2b shows an example shape 220, which comprises edges 221, 222, and 223. Edges 211 and 213 are substantially similar in length. Edges 221 and 222 meet at a vertex 224 at an angle of 90 degrees, while edges 222 and 223 meet at a vertex 225 at an angle of 90 degrees. Edges 221 and 223 are parallel and side-by-side with one another, so that shape 220 has a C-shaped contour. Shape 220 could be used to detect notch-type defects anywhere in an IC layout, regardless of the layout configuration around each notch-type defect.

Figure 3A:
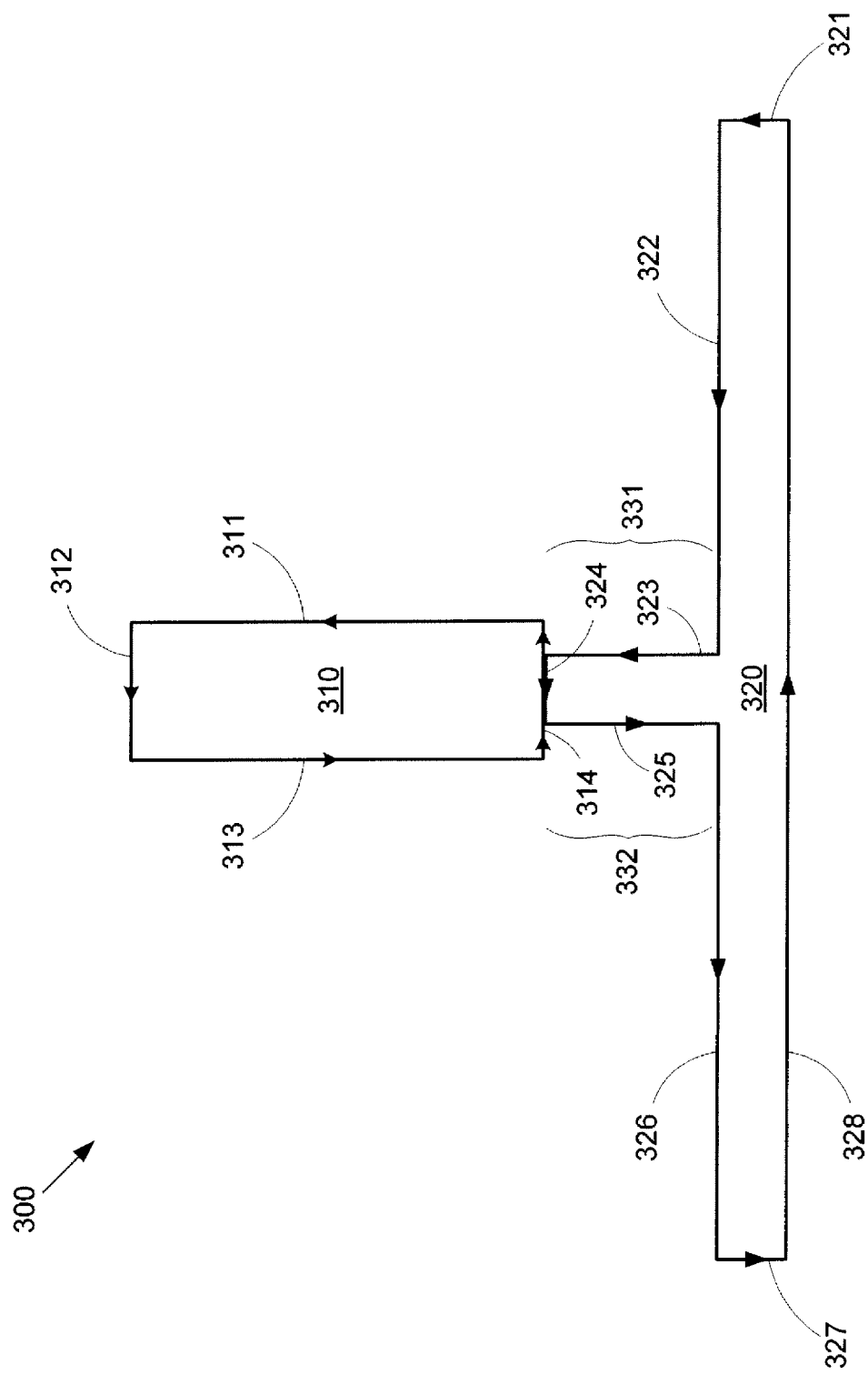
FIGS. 3a and 3b illustrate a type of multi-layer layout imperfection (necking) that would be difficult to detect and correct using conventional layout beautification methods, and an example shape that would allow detection of a necking-type layout imperfection.

FIG. 3 depicts an example of another type of common layout imperfection, showing a transistor element 300 commonly found in IC layouts. Transistor element 300 includes a gate polygon 310 and an interconnect polygon 320. Sometimes, polygons 310 and 320 are contained in separate gate and wire layers, respectively.

Gate polygon 310 includes contiguous edges 311-314 that form a rectangular outline. Interconnect polygon 320 comprises contiguous edges 321-328, with edges 323-325 forming a connection to gate polygon 310. Note that edge 324 of interconnect polygon 320 overlaps a portion of edge 314 of gate polygon 310 to provide gate-interconnect electrical connectivity in the final IC. Optimal electrical performance is achieved when the width of the connection formed by edges 323-325 of interconnect polygon 320 matches the width of gate polygon 310 (i.e., when the length of edge 314 is equal to the length of edge 324). However, in some cases, the width of the connection formed by edges 323-325 is narrower than the width of gate polygon 310 because the automated routers that create the actual IC layout typically use a minimum wire width to enable maximum device density. Thus, a "necking" type of layout imperfection arises in regions 331 and 332, where the gate wire connection is narrower than the gate itself.

This layout imperfection is extremely difficult to detect because the necking is not associated with any single polygon or even any single layer. Gate polygon 310 and interconnect polygon 320 are separate polygons on different layers, so neither one individually manifests a necking condition. Furthermore, even if this condition were detected, it would be difficult to widen and align the connection formed by edges 323-325 to match gate polygon 310 because the two polygons are on different layers of the IC layout. The aforementioned oversizing-undersizing technique would not change the final width of the connection formed by edges 323-325, unless interconnect polygon 320 was enlarged as a whole. This would be a generally undesirable solution due to the impact such a modification could have on other portions of the IC layout (and other portions of interconnect polygon 320).

Figure 3B:
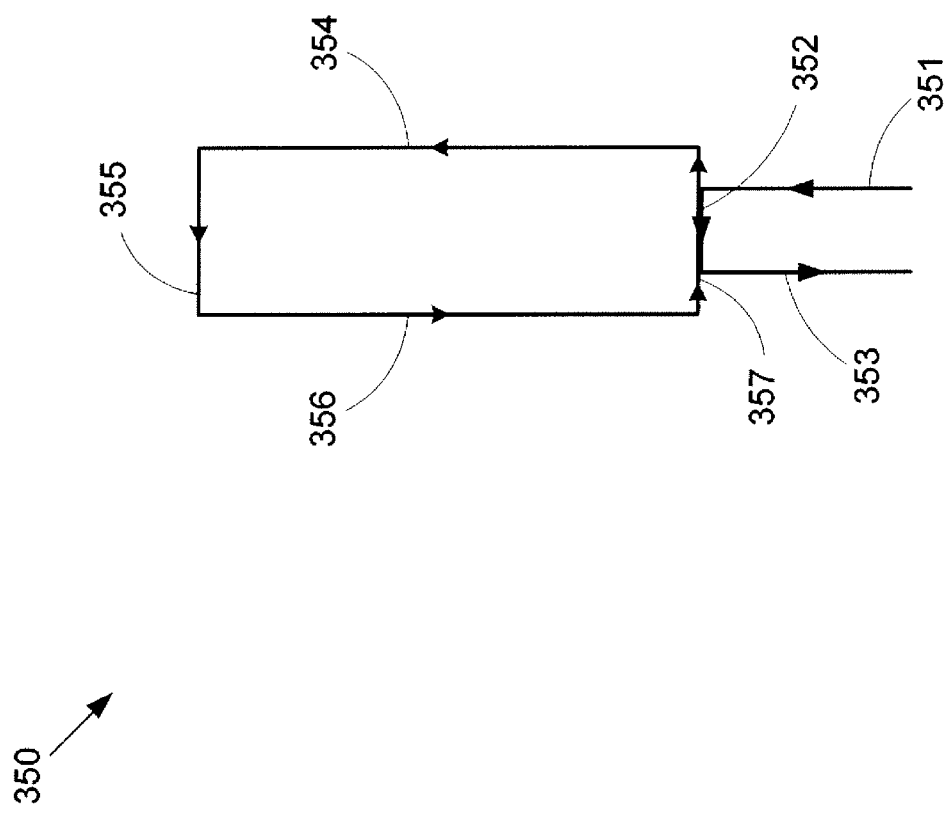

However, this type of layout imperfection can be readily detected and corrected by a shape-based layout beautification system. For example, FIG. 3b shows a shape 350 that includes contiguous edges 351-353, and contiguous edges 354-357. By associating edges 351-353 with the wire layer and edges 354-357 with the gate layer, shape 350 can be used to identify instances of the necking-type layout imperfection shown in FIG. 3a; i.e., edges 351-353 of shape 350 would correspond to edges 323-325, respectively, of interconnect polygon 320, while edges 354-357 of shape 350 would correspond to edges 311-314, respectively, of gate polygon 310. In addition, because shape 350 includes both the wire layer and gate layer information, a corrective action associated with shape 350 can accurately widen and align the connection formed by edges 323-325 of interconnect polygon 320 with gate 310.

Figure 4A:
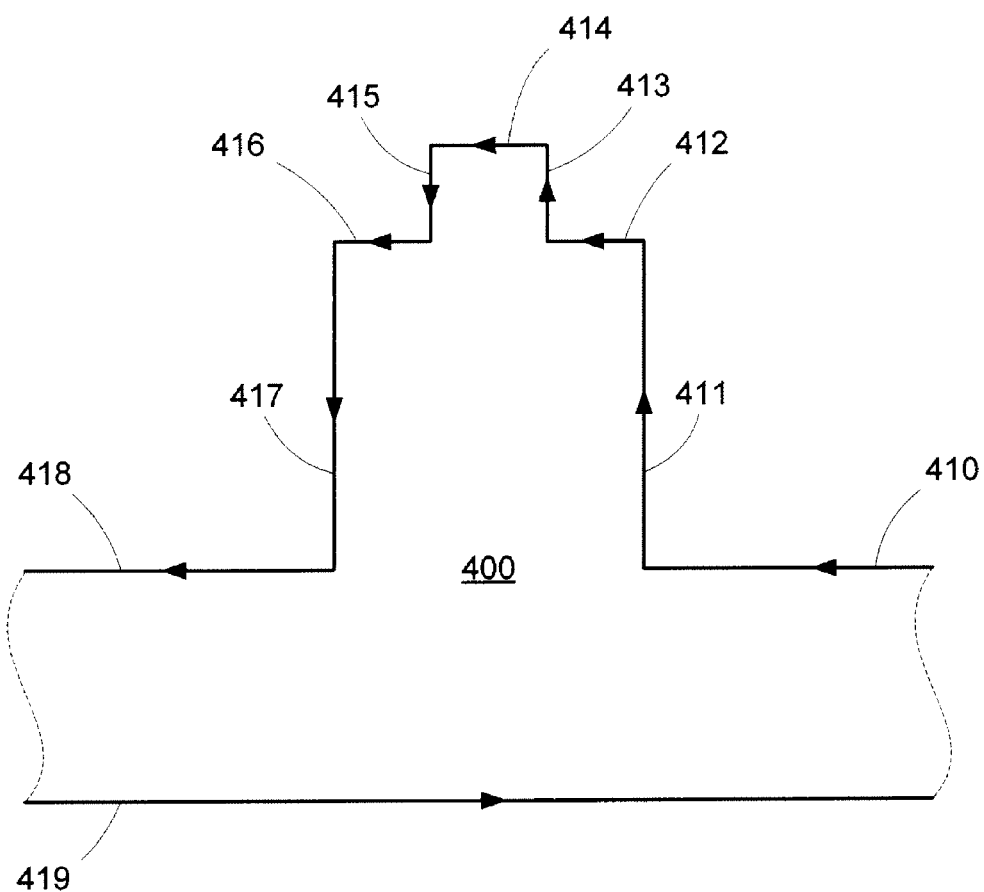
FIGS. 4a and 4b illustrate an example polygon including layout imperfections (reverse hammerhead) that would be difficult to detect and correct using conventional layout beautification methods, and an example shape that would allow detection of a reverse hammerhead-type layout imperfection.

FIG. 4a shows a portion of a polygon 400 that could represent a wire or interconnect in an IC layout. Polygon 400 comprises edges 410-419, with edges 410-418 being shown serially connected to form, for example, a connection to a transistor (not shown). The inverted serif created by edges 412 and 413, and the inverted serif created by edges 415 and 416 form a pattern sometimes referred to as a "negative hammerhead." Negative hammerheads are an OPC modification used to improve the optical performance of IC layout features (e.g., polygons or groupings of polygons) during lithography. However, OPC corrections are not necessary or even desirable in many situations. Where high optical precision is not required, OPC modifications (such as negative hammerheads) merely increase the data size and complexity of the IC layout, without providing any performance or manufacturability benefit. Unfortunately, because OPC tools often cannot distinguish between appropriate and inappropriate locations, OPC corrections must be applied in a blanket fashion.

Figure 4B:
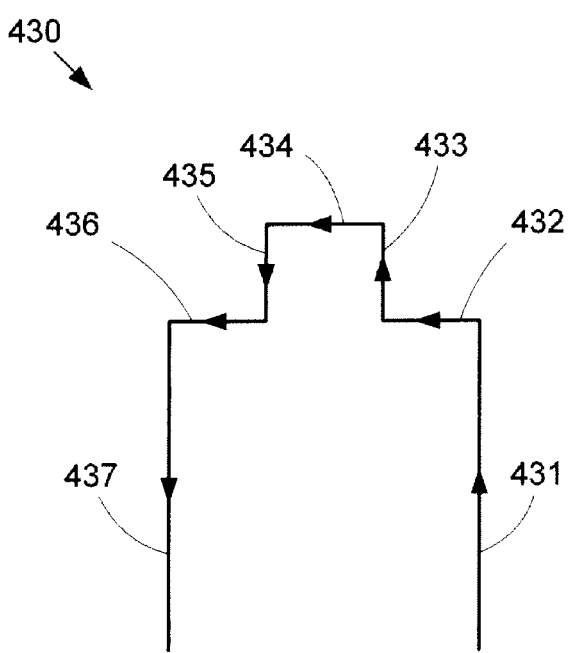

Once again, a shape-based system can enable detection of layout imperfections such as negative hammerheads. FIG. 4b shows a shape 430 comprising edges 431-437, which are arranged in a pattern similar to that of edges 411-417 of polygon 400 shown in FIG. 4a. By associating the appropriate properties (e.g., width between edges 431 and 437, length of edges 431 and 433, etc.) with the edges of shape 430, unwanted negative hammerheads in an IC layout can be detected.

Figure 5A:
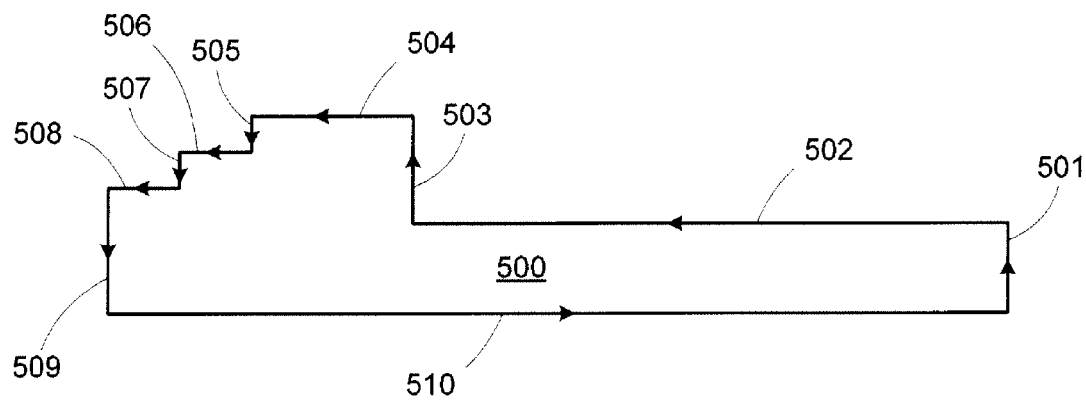
FIGS. 5a-5c illustrate an example layout imperfection (stair-step) that would be difficult to detect and correct using conventional layout beautification methods, an example shape that would allow detection of a stair-step-type layout imperfection, and an example of a possible corrected layout configuration.

FIG. 5a shows a polygon 500 that depicts another common type of layout imperfection. Polygon 500 comprises contiguous edges 501-510. The "stair-step" pattern formed by edges 505-508 can be produced by OPC operations, especially rule-based types of OPC. This type of stair-step pattern significantly increases layout data volume without a corresponding improvement in optical or electrical performance. Therefore, a polygon 530 shown in FIG. 5c, which comprises contiguous edges 531-536, provides a much more appropriate layout configuration. Polygon 530 replaces the stair-step pattern formed by edges 505-508 of polygon 500 with a single corner formed by edges 534 and 535. In this manner, polygon 530 reduces the edge-count of polygon 500 by 4 edges (10 edges for polygon 500 versus only 6 edges for polygon 530).

Unfortunately, detecting problematic stair-step patterns like that depicted in FIG. 5a is extremely difficult for conventional layout beautification systems. The individual edges 505-508 forming the stair-step are too nondescript to be readily detected by conventional edge-based systems, since such features cannot be easily distinguished from standard acceptable layout elements. Furthermore, even if a single edge forming part of a stair-step pattern could be detected, correcting the associated step would change the characteristics of the neighboring steps, further complicating the detection efforts of conventional beautification systems.

Figure 5B:
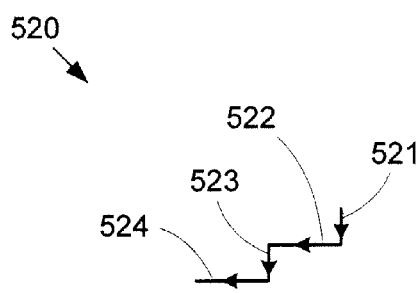
Figure 5C:
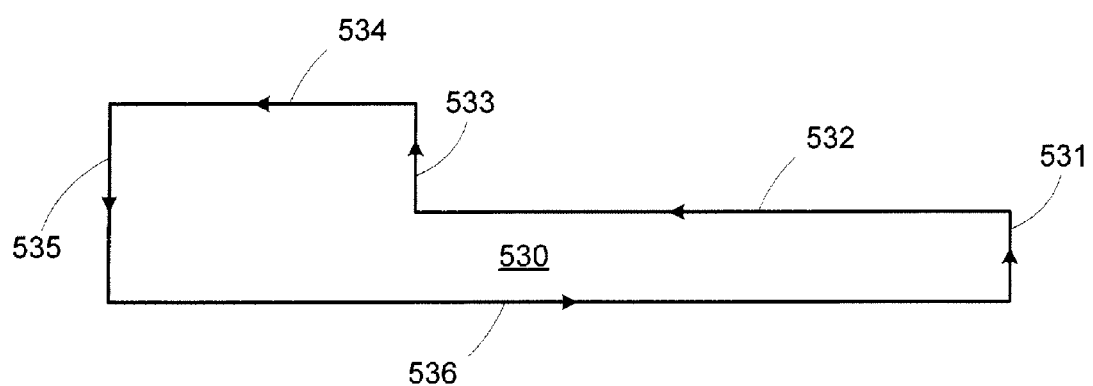

However, FIG. 5b shows a shape 520 that could be used to detect stair-step layout imperfections. Shape 520 includes edges 521-524, which themselves are arranged in a stair-step pattern. Therefore, shape 520 could be used to detect the pattern formed by edges 505-508 of polygon 500 (with edges 521-524 of shape 520 corresponding to edges 505-508, respectively, of polygon 500). A desired corrective action could then be applied to the detected stair-step pattern. Note that while shape 520 is shown having four edges, shapes with more or less edges could be defined to detect stair-step imperfections having a greater or lesser number of steps. Also, shape 520 could include additional edges corresponding to edges 504 and 509 of polygon 500, thereby providing greater identification specificity. In any case, by defining a stair-step shape of some sort, stair-step-type layout imperfections can be readily identified and corrected in a single operation.

Figure 11A:
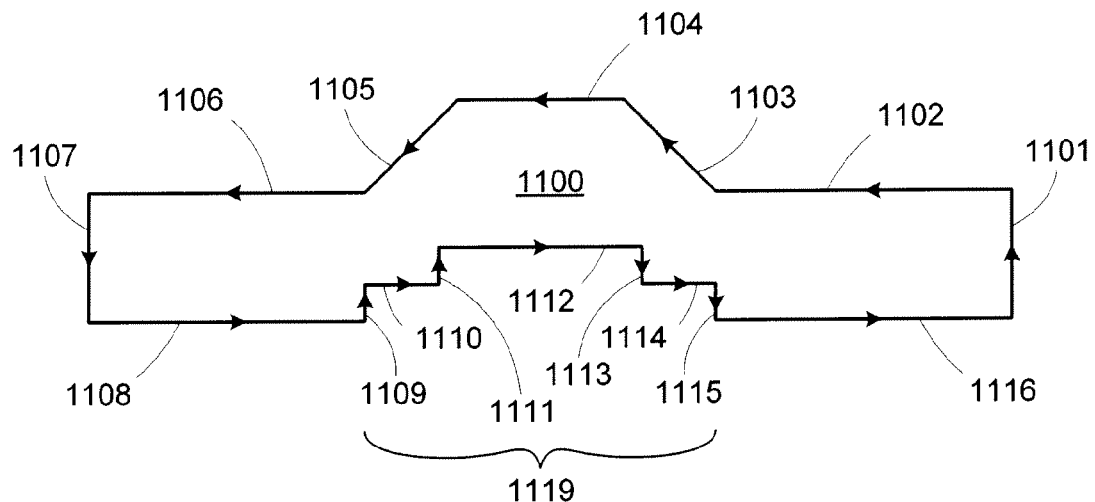
FIGS. 11a-11c illustrate an example layout imperfection (stepped notch) that would be difficult to detect and correct using conventional layout beautification methods, an example of a possible corrected layout configuration, and an example shape that would allow detection of a stepped notch-type layout imperfection.

FIG. 11a shows a polygon 1100 that includes another type of layout imperfection that would be difficult to detect and correct using conventional layout beautification methods. Polygon 1100 comprises contiguous edges 1101-1116. Edges 1109-1115 form a "stepped notch" 1119 in one side of polygon 1100. Stepped notch 1119 could, for example, be an OPC feature created to compensate for the angled profile of the bulge formed by edges 1103-1105. However, the stair-step configuration of stepped notch 1119 undesirably increases the data volume required by polygon 1100 without providing significant improvement in optical or electrical performance.

Figure 11B:
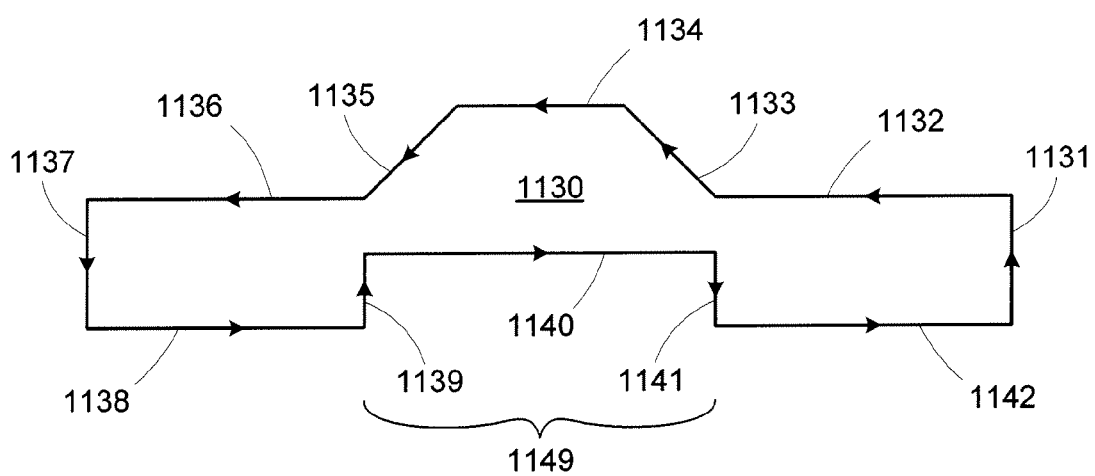

It would therefore be desirable to reconfigure polygon 1100 into a more data-efficient formation, such as polygon 1130 shown in FIG. 11b. Polygon 1130 comprises edges 1131-1142 and replaces stepped notch 1119 of polygon 1100 with a simple rectangular notch 1149 (formed by edges 1139-1141). Rectangular notch 1149 of polygon 1130 provides substantially the same OPC performance as stepped notch 1119 of polygon 1100, but with significantly reduced data volume.

Figure 11C:
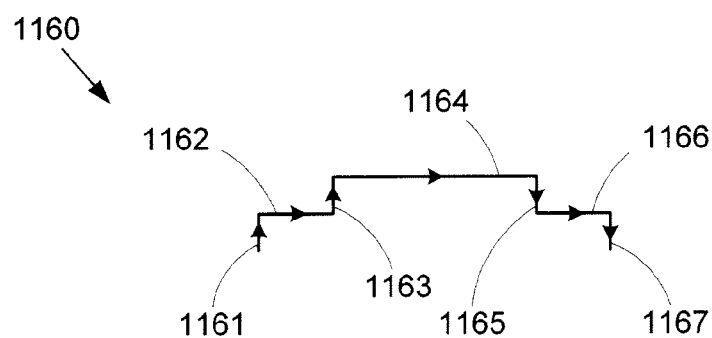

Once again, like the stair-step pattern described with respect to FIG. 5a, the stepped notch shown in FIG. 11a is both difficult to detect and correct using conventional layout beautification techniques, for much the same reasons as described with respect to FIG. 5a. However, by defining a shape 1160 as shown in FIG. 11c, stepped notches such as indentation 1119 can be readily identified. Shape 1160 includes contiguous edges 1161-1167 that are themselves arranged in a stepped notch configuration. Shape 1160 can then be used to identify the pattern formed by edges 1109-1115 of polygon 1100. A desired corrective action could then be applied to the detected stepped notch. Note that while shape 1160 is shown having 7 edges, shapes with more or less edges could be defined to detect stepped notch imperfections having a greater or lesser number of steps. Also, shape 1160 could include additional edges corresponding to edges 1108 and 1116 of polygon 1100, thereby providing greater identification specificity.

Figure 6C:
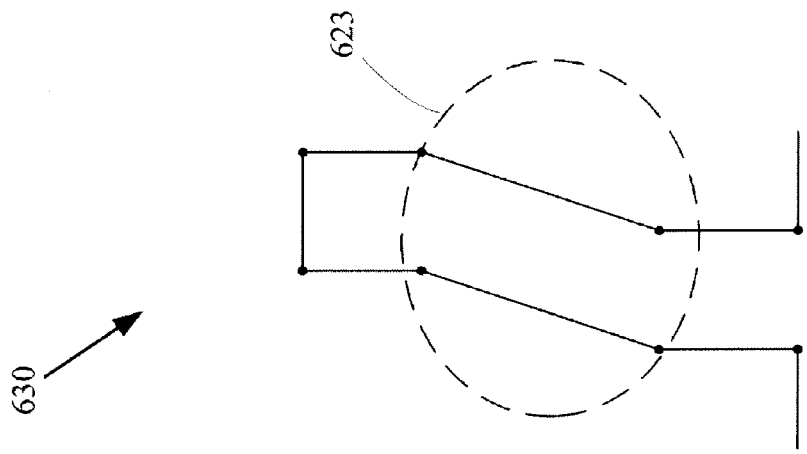
FIGS. 6a-6c illustrate IC layout features that differ from each other only in certain regions.
Figure 6B:
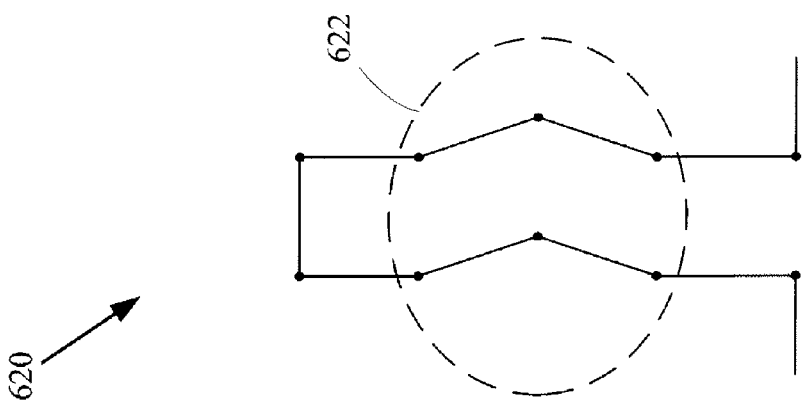
Figure 6A:
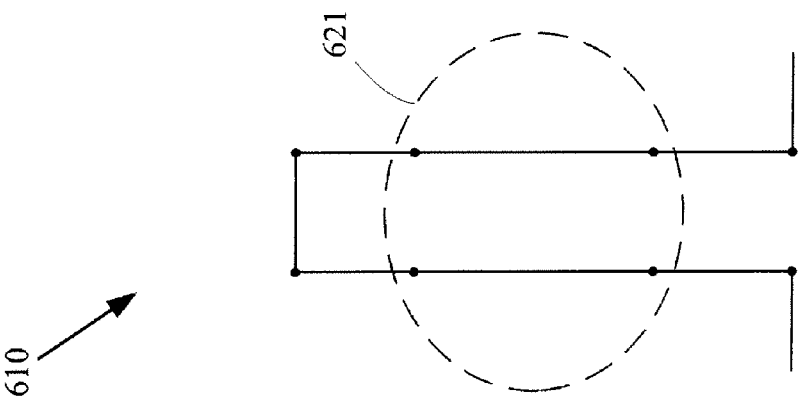

FIGS. 6a, 6b, and 6c show IC layout elements 610, 620, and 630, respectively. Elements 610, 620, and 630 significantly differ only in indicated regions 621, 622, and 623, respectively. Therefore, one shape with "wildcard" functionality could be used to identify all of elements 610, 620, and 630. Specifically, in accordance with another aspect of the invention, a shape may include a "wildcard" property (or properties), wherein the wildcard property represents multiple alternative relationships between certain edges. A wildcard property therefore allows a single shape to identify a range of actual IC layout elements.

Figure 6D:
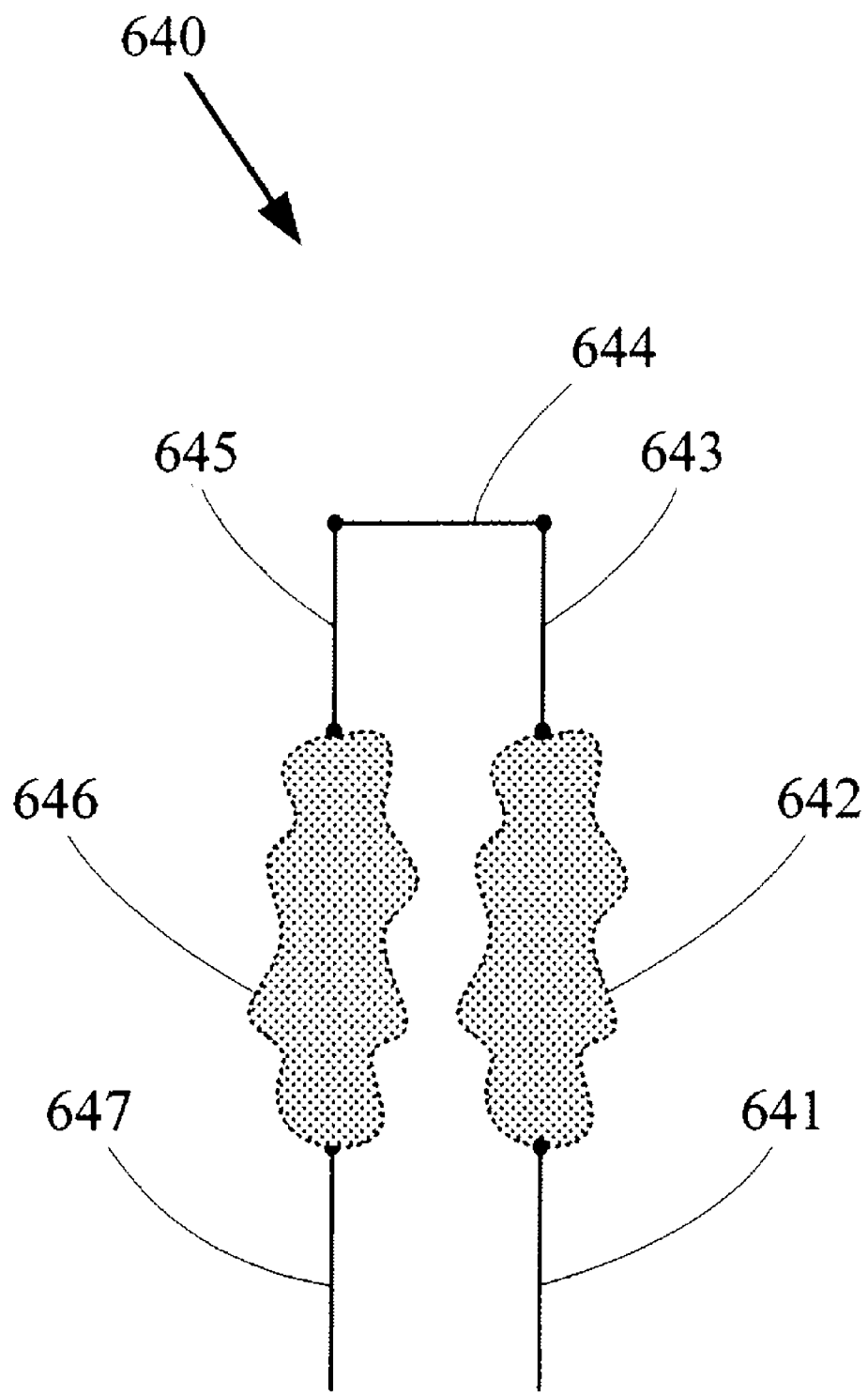
FIG. 6d illustrates a shape having an indeterminate section that provides wildcard functionality.

For example, FIG. 6d shows a shape 640 comprising edges 641, 643-645, and 647, and indeterminate regions 642 and 646. Edges 643-645 are contiguous, while edges 641 and 643 are coupled by indeterminate region 642, and edges 645 and 647 are coupled by indeterminate region 646. Indeterminate region 642 may be defined as any linkage between edges 641 and 643. Similarly, region 646 may be defined as any linkage between edges 645 and 647. Indeterminate regions 642 and 646 therefore allow shape 640 to match any layout element having edges 641, 643-645, and 647, regardless of how those edges are coupled. Additional limitations on the regions as a whole (length, width, number of included edges, etc.) and on individual edges within the regions (length, color, orientation, etc.) may be imposed to restrict the potential range of shapes matched by shape 640. For example, regions 642 and 646 might be limited to a single line segment thus enabling shape 640 to match shapes 610 and 630 shown in FIGS. 6a and 6c, respectively, but not match shape 620 shown in FIG. 6b.

Action Definition

Once the shapes have been determined, corrective actions ("actions") may be formulated based on those shapes and their property variables (such as those listed previously). The shape definitions and/or actions may be provided as defaults by the system, or can be partially or fully defined by a user. In an embodiment of the invention, a graphical user interface (GUI) can be provided to allow the user to input custom shapes and actions. In another embodiment of the invention, a predetermined shape/action file may be loaded from an external source.

Because each shape will typically correspond to a particular layout imperfection, the action(s) associated with that shape would typically be defined to eliminate or minimize that layout imperfection. For example, consider shape 220 shown in FIG. 2b. As noted previously, shape 220 could be used to detect notch-type elements such as notch 111 shown in FIG. 1a.

Once shape 220 has been defined, an action or set of actions can then be associated with shape 220. In an actual layout beautification operation, shape 220 would first be used to detect an element(s) (i.e., grouping(s) of associated edges) in an IC layout having the same general configuration (i.e., notch-shaped). Then, depending on the particular parameters of the matching layout element(s), the action(s) associated with shape 220 would be applied. For example, Table 1 lists four sample actions that could be used in a notch-correction scheme.

TABLE 1

Sample Shape-Based Design Rules

| # | L(222) (μm) | L(221), L(223) (μm) | 224, 225(deg.) | ACTION |
|---|---|---|---|---|
| 1 | <0.5 | 0.25 ± 0.05 | 90 ± 5 | BIAS 222 OUTWARD BY 0.25 μm |
| 2 | <0.5 | <0.25 | 90 ± 5 | BIAS 222 OUTWARD BY L(221) |
| 3 | <0.5 | <0.25 | 90 ± 5 | BIAS EDGES CONTIGUOUS WITH EDGES 221 AND 223 (OTHER THAN EDGE 222) INWARD BY L(221) |

TABLE 1-continued

Sample Shape-Based Design Rules

| # | L(222) (μm) | L(221), L(223) (μm) | 224, 225(deg.) | ACTION |
|---|---|---|---|---|
| 4 | <0.5 | <0.25 | 90 ± 5 | REPLACE SHAPE 220 WITH LINE |

Note: As used above the notation L(edge #) refers to the length of the given edge, e.g. L(221) refers to the length of edge 221.

Application of any of the actions would first involve checking to make sure that the listed dimensional specifications were met. For example, if notch 111 shown in FIG. 1a were matched by shape 220, edges 102, 103, and 104 of polygon 100 would correspond to edges 221, 222, and 223 of shape 220. Application of action 1 to notch 111 would require that edge 103 be less than 0.5 μm, and edges 102 and 104 be equal to 0.25 μm±0.05 μm. In such a case, edge 103 would be biased outward by 0.25 μm, thereby minimizing or eliminating notch 111.

Action 1 provides an example of an "absolute" action, wherein the action completely and independently specifies the desired operation (i.e., bias edge 222 outward by 0.25 μm). However, "adaptive" actions can also be specified, in which the desired operation is a function of an existing layout parameter.

For example, rather than specifying a fixed bias value, the bias of action 2 is dependent on the length of edge 221. Thus, in FIG. 1a, if edge 103 (corresponding to edge 222 of shape 220) is less than 0.5 μm and edges 102 (edge 221) and 104 (edge 223) are less than 0.25 μm, action 2 would bias edge 103 outward by the length of edge 102. In this manner, action 2 will always eliminate notch 111, regardless of its actual depth.

Action 3 provides another example of an adaptive action for notch-type defects. However, rather than "filling" a notch type defect by biasing the innermost edge of the notch outward, action 3 eliminates the notch by biasing outer edges adjacent to the notch inward, sometimes referred to as "negative biasing". For example, action 3 could be applied to notch 111 of polygon 100 shown in FIG. 1a, in which case edges 101 and 105 would be shifted inwards into alignment with edge 103. While performing this type of modification would be very difficult using conventional DRC-based techniques, making such a modification can be readily achieved using a shape-based action Another type of action is a "replacement" action, wherein the matched layout element is replaced with a completely different shape. Action 4 provides an example of a replacement action. Any notch to which action 4 is applied is replaced by a straight line, thereby removing the layout imperfection. For example, applying action 4 to notch 111 of polygon 100 shown in FIG. 1a would replace edges 102-104 with a straight line between edges 101 and 105.

Actions can be associated with more complex shapes in a similar manner. FIG. 12 shows an example polygon 1200 made up of contiguous edges 1201-1210. Polygon 1200 includes a protrusion 1211 formed by edges 1203-1207, which could represent an unnecessarily complex OPC modification (i.e., layout imperfection) created by an automated OPC tool. In such an instance, it might be desirable to convert protrusion 1211 into a simpler configuration. An example of such a configuration is depicted in FIG. 12b, which shows a modified polygon 1220 formed by contiguous edges 1221-1228. Polygon 1220 includes a protrusion 1231 formed by edges 1223-1225. Protrusion 1231 has a simple rectangular profile, in contrast to the multi-level profile of protrusion 1211 of polygon 1200.

Figure 12A:
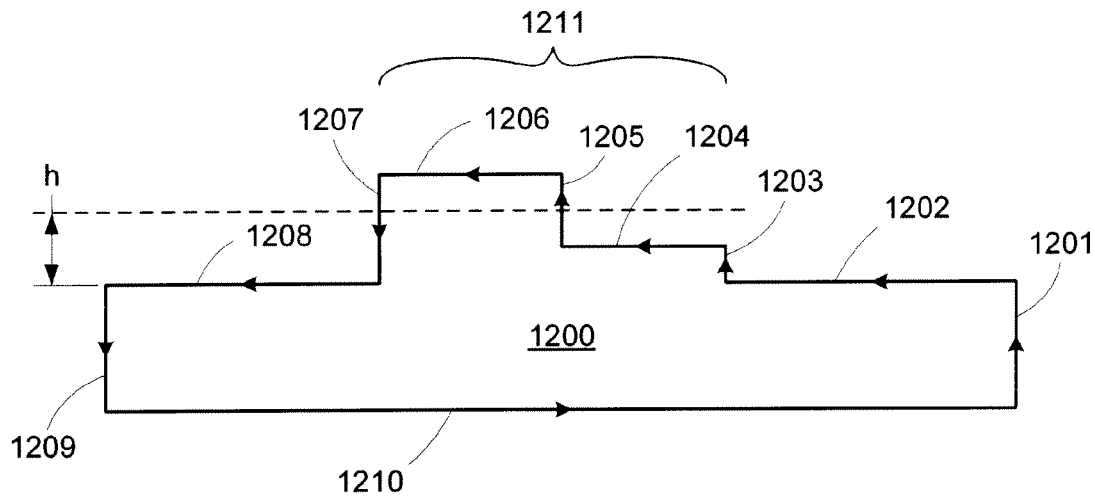
FIGS. 12a-12c illustrate an example layout imperfection (multilevel protrusion) that would be difficult to detect and correct using conventional layout beautification methods, an example of a possible corrected layout configuration, and an example shape that would allow detection of a multilevel protrusion-type layout imperfection.
Figure 12B:
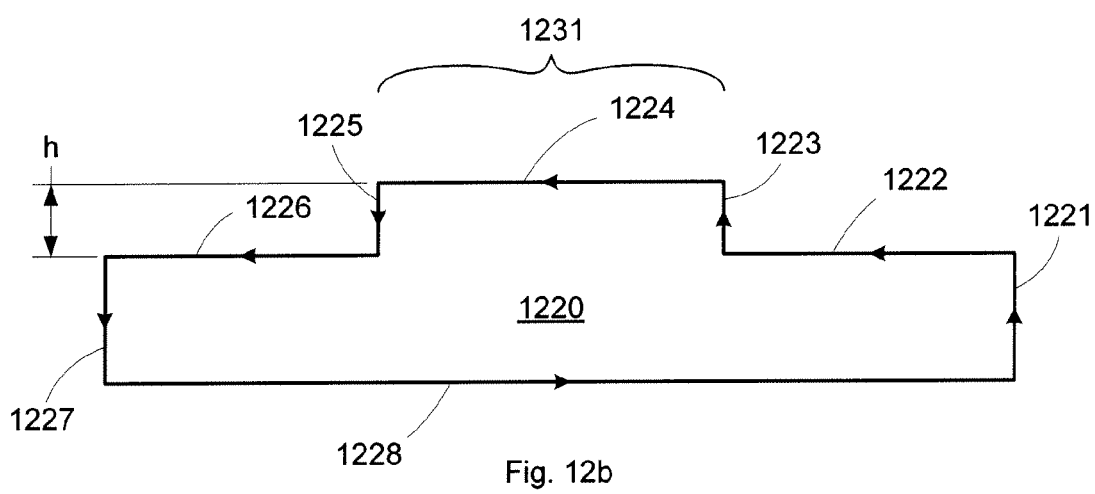
Figure 12C:
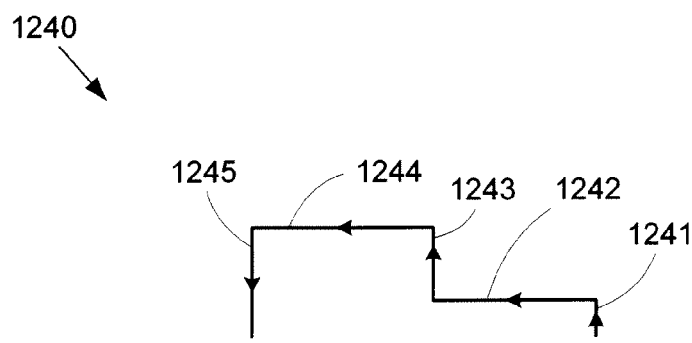

To detect layout imperfections such as protrusion 1211 shown in FIG. 12a, a shape such as shape 1240 shown in FIG. 12c could be defined. Shape 1240 includes contiguous edges 1241-1245, which match the pattern of edges 1203-1207, respectively, shown in FIG. 12a. An action or a set of actions can then be associated with shape 1240. Table 2A lists various sample actions that could be used to correct the layout imperfection shown in FIG. 12a.

TABLE 2A

Additional Sample Shape-Based Design Rules

| # | L(1241) (μm) | L(1245) (μm) | Action |
|---|---|---|---|
| a1 | <h | >h | BIAS 1242 OUTWARD BY (h – L(1241)); BIAS 1244 INWARD BY (L(1245) – h) |
| a2 | <h | <h | BIAS 1242 OUTWARD BY (h – L(1241)); BIAS 1244 OUTWARD BY (h – L(1245)) |
| a3 | >h | >h | BIAS 1242 INWARD BY (L(1241) – h); BIAS 1244 INWARD BY (L(1245) – h) |

TABLE 2B

Alternative to 2A

| | | | |
|---|---|---|---|
| B | ANY | ANY | REPLACE EDGES 1241-1245 WITH RECTANGULAR PROTRUSION HAVING HEIGHT h (e.g., EDGES 1223-1225 OF FIG. 12b) |

Just as with the actions listed in Table 1, application of any of the actions shown in Table 2A would first involve comparing the characteristics of the underlying shape (in this case the dimensions, layer associations, etc., of shape 1240) with any potentially matching layout elements. Those characteristics could be incorporated into either the action definitions or the shape definition. For the sake of clarity, Table 2A lists only two dimensional variables for each action associated with shape 1240 (i.e., the lengths of edges 1241 and 1245), although it is noted that much more detailed action definitions could be provided.

Action a1 addresses the particular layout imperfection manifested by polygon 1200 shown in FIG. 12a. Edge 1204 of polygon 1200 is below the desired height h (i.e., edge 1203 is less than height h), while edge 1206 is above the desired height h (i.e., edge 1207 is greater than height h). Therefore, action a1 would bias edge 1204 (corresponding to edge 1242 of shape 1240) outward by the difference between desired height h and the length of edge 1203 (corresponding to edge 1241 of shape 1240). Action a1 would also negative bias (i.e., bias inward) edge 1206 (corresponding to edge 1244 of shape 1240) by the difference between edge 1207 (corresponding to edge 1245 of shape 1240) and desired height h. In this manner, edges 1204 and 1206 of polygon 1200 would be aligned, and multi-layer protrusion 1211 of polygon 1200 would be converted into a simple rectangular protrusion of height h.

Note that while FIG. 12a shows edges 1204 and 1206 of polygon 1200 being below and above, respectively, desired height h, other similar layout imperfections might not share those characteristics. For example, both edges 1204 and 1206 might be below desired height h. Alternatively, both edges 1204 and 1206 might be above desired height h. Actions a2 and a3 listed in Table 2A can be used to address these situations. In action a2, the edges of a matching layout imperfection corresponding to edges 1242 and 1244 of shape 1240 would be biased outward to height h. Similarly, in action a3, the edges of a matching layout imperfection corresponding to edges 1242 and 1244 of shape 1240 would both be biased inward to height h. Thus, actions a2 and a3 extend the corrective reach of shape 1240 without altering the definition of shape 1240.

Note that actions a1-a3 are all relative actions, as those actions are based on the actual lengths of the layout edges corresponding to shape edges 1241 and 1245. Table 2B lists a sample replacement action b in which any layout imperfection matching shape 1240 would be replaced by a rectangular protrusion of height h. Because the detected layout imperfection is being completely replaced rather than modified, action b can provide the same scope of coverage as actions a1-a3 in a single action.

Note that while absolute, adaptive, and replacement actions have been described by way of example, any type of action can be performed in response to a shape match. Also, the original shape definition may be as detailed or as basic as desired by the user. For example, the definition of shape 220 shown in FIG. 2 could include greater specificity with respect to the dimensions of edges 221-223. This in turn would mean that the rules associated with shape 220 would have less dimensional requirements. In general, shape and action definitions can have any degree of specificity desired by the user.

Shape Matching and Action Application

Figure 7:
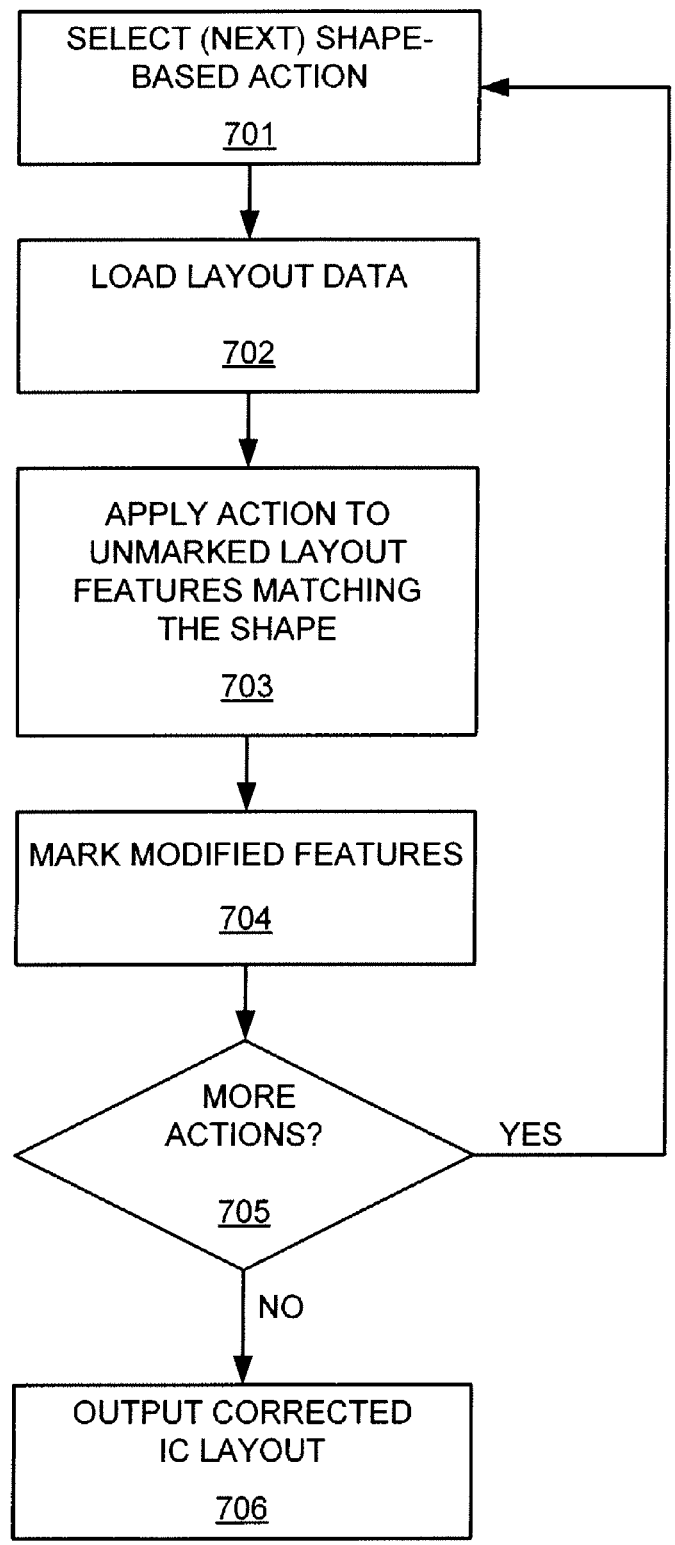
FIG. 7 is a process flow diagram of a shape-based layout beautification operation using sequential processing.

Once the shapes and actions have been defined, a layout beautification system can correct layout imperfections in an IC layout. The actual beautification process can take various forms. For example, FIG. 7 shows a sequential processing algorithm in accordance with an embodiment of the invention.

In step 701, a shape-based action is selected from a predefined set of actions. In step 702, the appropriate IC layout data is loaded into the layout beautification system. For example, some actions may require only one layer of the IC layout, while others may require 2 or 3 layers. Therefore, in step 702, only those layers that are required by the action selected in step 701 need be loaded.

Then, in step 703, the selected action is applied to the elements (i.e., groups of associated edges) within the IC layout that match the associated shape. These modified elements are then marked in step 704. If there are additional actions remaining (step 705), the process loops to step 701, where the next action is selected and the iterative process continues.

Note that the actual action application performed in step 703 involves only those elements that have not been previously marked (i.e., only those elements that not been modified by a previously applied action). Alternatively, the entire layout could be scanned for every action, in which case step 704 would not be required. However, this comprehensive action application could introduce unintended consequences due to the difficulties involved in predicting the various intermediate layout configurations created after each action application. Checking only the unmarked elements would not only provide a more predictable result, but also could provide a significant time savings by reducing the total number of action applications. After the entire set of actions has been exhausted, the final corrected IC layout is output in step 706.

Figure 8:
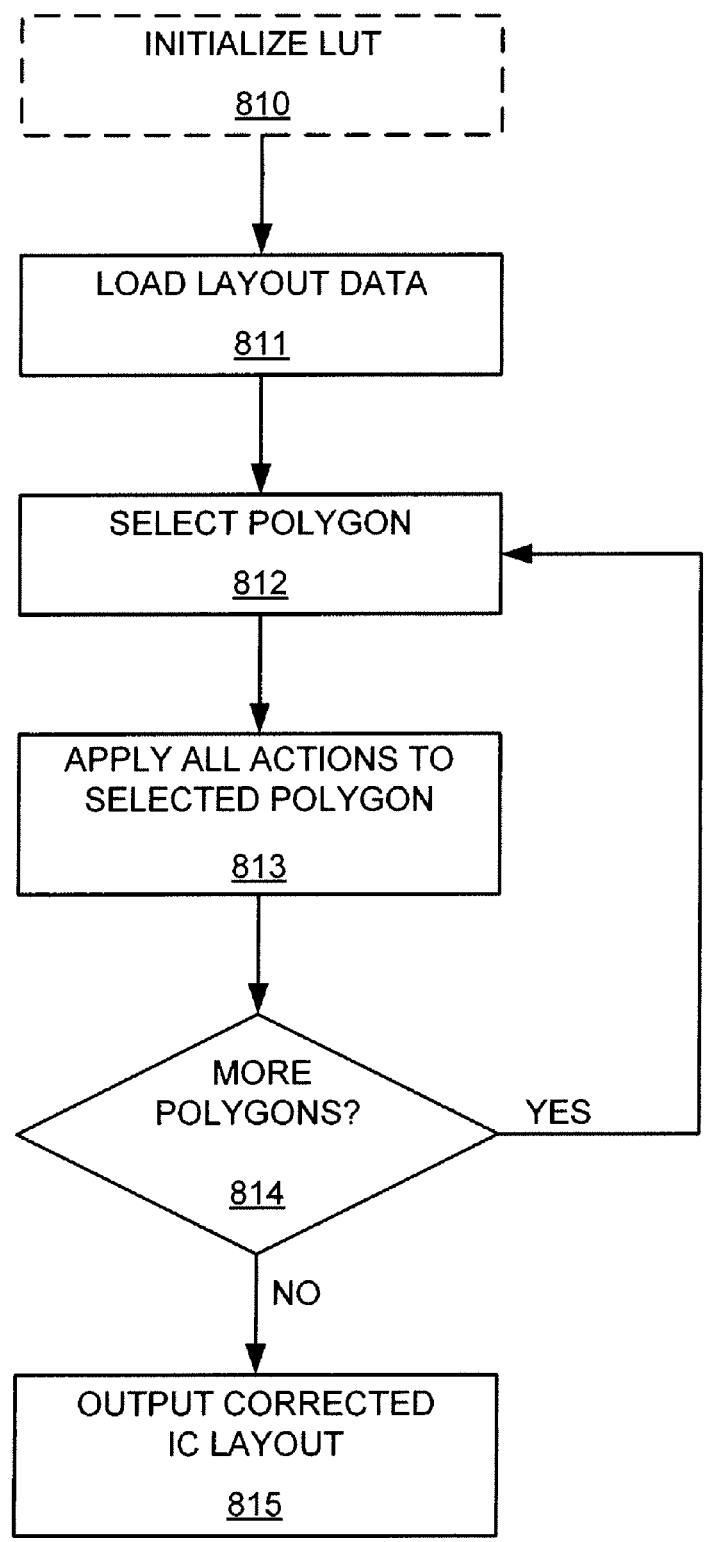
FIG. 8 is a process flow diagram of a shape-based layout beautification operation using concurrent processing with an optional LUT.

According to another embodiment of the invention, the shape-based actions can be applied to an IC layout using a concurrent processing algorithm, as shown in FIG. 8. In a concurrent processing system, all the actions are applied in a batch operation. For such a method, the shapes and associated actions could be incorporated into a lookup table (LUT) for enhanced performance. Accordingly, optional step 810 allows for the initialization of a LUT prior to the actual action application.

A LUT can significantly improve the performance of a concurrent processing system by allowing the concurrent action application step to be performed as a simple table lookup, rather than a more time-consuming series of computations. Therefore, the number of action and/or the complexity of the IC layout data can be increased without significantly increasing the total runtime of the layout beautification operation. In a sequential layout beatification system, runtime is essentially proportional to the number of actions. Contrastingly, in a concurrent processing layout beautification system that incorporates a LUT, an order of magnitude increase in the number of actions will typically result in less than a 100% increase in runtime.

Thus, while some time is required for initialization of the LUT at the start of the layout beautification operation, this additional time is negligible in relation to the overall time savings provided by the LUT. According to an embodiment of the invention, "initialization" of a LUT can comprise the creation of the LUT from a set of actions. According to another embodiment of the invention, the "initialization" can simply involve the loading of a predefined LUT into the layout beautification system, e.g. from a file or across a network.

According to an embodiment of the invention, the initialization of the LUT can be performed as soon as the layout beautification system is loaded. This immediate initialization would eliminate the need for initialization of the LUT during the actual layout beautification operation on a particular layout and provide maximum throughput. Alternatively, the LUT could be initialized at the start of every layout beautification operation, which would cause a slight increase in total runtime but ensure that any user modifications to the shapes or actions are properly incorporated.

In step 811, the IC layout data is loaded into the layout beautification system. Depending on the state of the IC layout data, the loading operation performed in step 811 can include manipulation of the input data. For example, the original IC layout data may have been a "fractured" data file (i.e., the polygons of the IC layout may have been broken into layout primitives such as rectangles or trapezoids, such as in an e-beam tooling file). In that case, the loading operation of step 811 would involve reassembling the fractured primitives into complete polygons. Similarly, the input IC layout data file might have a file format different than that used by the layout beautification algorithm. In such a case, step 811 would have to incorporate a format translation operation.

Once the IC layout data has been input and properly processed, a first polygon is selected in step 812. In step 813, the entire set of actions is applied to the selected polygon. According to an embodiment of the invention, the rule application of step 813 is performed by scanning the polygon in a counter clockwise direction and matching the edges and vertices making up the polygon against the pre-defined shapes on which the actions are based. Accordingly, multiple shapes can match elements within the polygon as this scanning progresses.

According to an embodiment of the invention, checking of an element within a polygon is stopped once an action is applied to that element. Therefore, all the actions may not necessarily be applied to a given element, and the actions must be ordered to account for this constraint. For example, actions relating to critical layout imperfections may be placed at the beginning to ensure that those critical layout imperfections are addressed. Alternatively, the actions dealing with the most common (numerous) layout imperfections can be placed at the head of the list to optimize overall layout beautification runtime.

According to another embodiment of the invention, actions can be applied to matching layout elements regardless of whether or not a previous action application has been performed. According to another embodiment of the invention, after any action is applied to a layout element, the modified polygon is rescanned with the complete list of actions.

If there are more polygons to be examined, step 814 loops the process back to step 812, where the next polygon is selected, and the action application process continues. After the actions have been applied to all the polygons in the IC layout, the final corrected IC layout is output in step 815.

Because the entire set of actions is applied to each layout element as it is selected, the concurrent processing algorithm shown in FIG. 8 will typically be more computationally efficient than the sequential processing algorithm shown in FIG. 7. A concurrent processing system eliminates the processing overhead associated with rescanning the layout geometry for every action and reloading updated layout data after every action application.

Shape-Based Layout Beautification System

Figure 9:
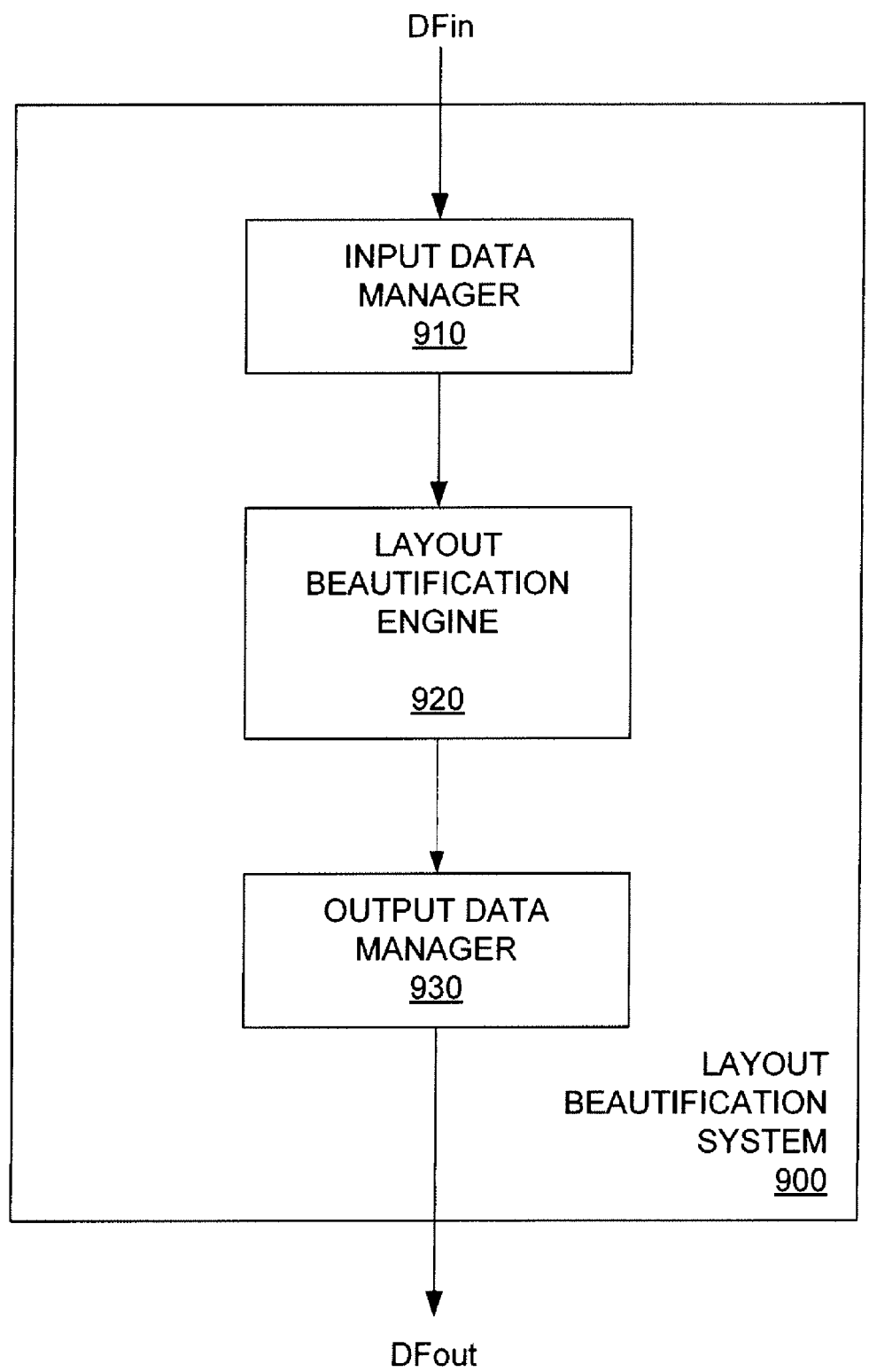
FIG. 9 illustrates a schematic diagram of a layout beautification system.

FIG. 9 shows a diagram of a layout beautification system 900 in accordance with an embodiment of the invention. Layout beautification system 900 comprises an input data manager 910, a layout beautification engine 920, and an output data manager 930. Input data manager 910 is coupled to receive an IC layout data file DFin. Data file DFin can comprise an entire IC layout, or a selected portion(s) of an IC layout. Furthermore, data file DFin could represent the output of an automated layout design tool such as an OPC or routing tool. According to an aspect of the invention, data file DFin may be a standard layout database file exchange format such as GDS, GDS-II, DXF, CIF, IGES, a flat file, or even a proprietary database file format. More generally, any data file format that defines the geometry of an IC layout could be used.

Input data manager 910 converts data file DFin to a form that may be manipulated and processed by layout beautification engine 920. In an embodiment of the invention, input data manager 910 selects and organizes the layout data to be analyzed/modified from within data file DFin. For example, data file DFin may need to be separated into various layers, or a multi-part layout may need to be combined into a single file. Also, input data manager 910 could "reassemble" the layout primitives of fractured data files into complete polygons. According to an embodiment of the invention, a user can configure the operational parameters of input data manager 910.

Layout beautification engine 920 then performs layout beautification on the layout data provided by input data manager 910. According to various embodiments of the invention, layout beautification engine 920 can incorporate a shape-based sequential processing system as described with respect to FIG. 7, or a shape-based concurrent processing system as described with respect to FIG. 8, or a shape-based (and LUT-based) concurrent processing system as described with respect to FIG. 8.

After any layout imperfections have been corrected by layout beautification engine 920, it is fed to output data manager 930. The processed data can be converted by output data manager 930 into an output data file DFout. In an embodiment of the invention, output data file DFout can be converted to the same layout data file format as input data file DFin. In another embodiment of the invention, a user may select a file format for data file DFout. According to another embodiment of the present invention, output data file DFout can then be fed to another automated layout processing tool, such as an OPC tool.

Figure 10:
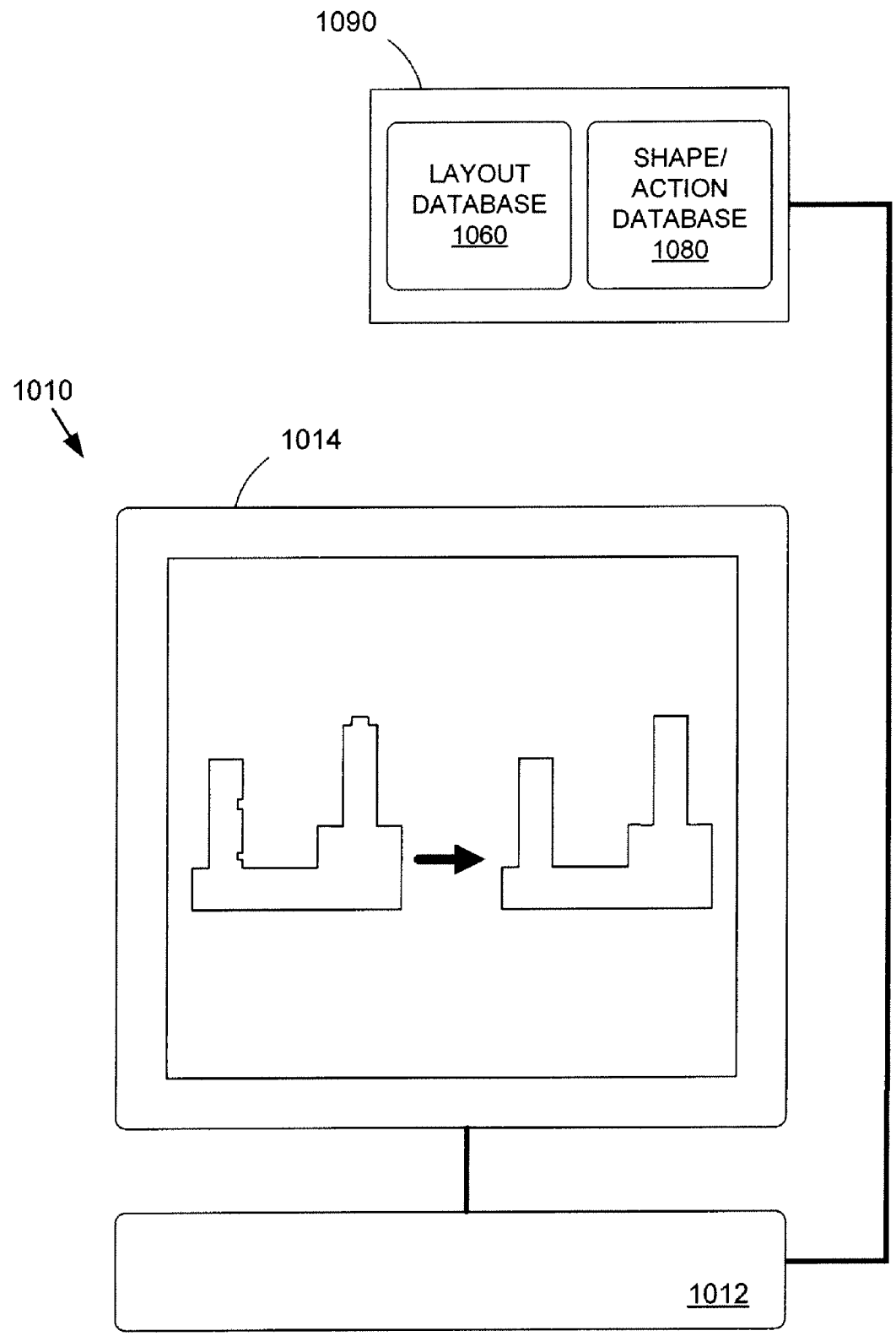
FIG. 10 illustrates an embodiment of a layout beautification system including access to remote design rule and layout databases.

FIG. 10 provides a physical representation of layout beautification system 900 shown in FIG. 9, according to an embodiment of the invention. FIG. 10 shows a computer system 1010 comprising a processor 1012 and a graphical display 1014. Alternatively, computer system 1010 could include multiple processors. Computer system 1010 includes software to perform the operations described with reference to layout beautification system 900 in FIG. 9. Computer system 1010 could include a personal computer (PC) running Microsoft™ or UNIX/POSIX software and/or a workstation. Display 1014 allows a user to monitor, modify, and control the layout beautification process being performed by computer system 1010.

FIG. 10 also shows a layout database 1060 and a shape/action database 1080, both of which may be located in a network storage location 1090 (apart from computer system 1010). Layout database 1060 stores IC layout data files, while shape/action database 1080 houses shapes and/or actions for use in layout beautification operations. Alternatively, the layout data files and shapes/actions could be stored locally in computer system 1010. Computer system 1010 may access layout database 1060 for files on which to perform layout beautification, and may access shape/action database 1080 for appropriate shapes and/or actions for the layout beautification. In an embodiment of the invention, databases 1060 and 1080 may be accessed through a local area network (LAN). In another embodiment of the invention, databases 1060 and 1080 may be accessed though a wide area network (WAN), such as the Internet.

Thus, an efficient and powerful technique for performing layout beautification is described. By using a shape-based identification system, seemingly similar patterns within a layout can be readily distinguished, complex layout patterns can be detected, and layout imperfections can be precisely targeted. By incorporating shape-based actions into a LUT, the time required to perform layout beautification can be reduced. The above disclosure is not intended to be limiting. Numerous modifications and variations of the invention will be apparent. Therefore, the invention is limited only by the following claims.

The invention claimed is:

1. A non-transitory, computer-readable medium embodying instructions that when executed by a processor perform a layout beautification operation on an integrated circuit comprising a plurality of polygons, the instructions performing steps comprising:

using shape-based identification to identify a layout imperfection on a polygon, the layout imperfection representing an unintended irregularity that adversely affects at least one of layout printability, device performance, and data volume when an integrated circuit layout is fractured;

applying a targeted correction to eliminate the layout imperfection, the targeted correction reducing a number of edges of the polygon; and outputting a corrected integrated circuit layout including the targeted correction.

2. The computer-readable medium of claim 1, wherein applying the targeted correction includes applying an absolute correction.

3. The computer-readable medium of claim 2, wherein applying the absolute correction includes performing an operation using a fixed value associated with an existing layout parameter of the layout imperfection.

4. The computer-readable medium of claim 2, wherein using the shape-based identification and applying the targeted correction form part of a sequential processing algorithm for a plurality of layout imperfections.

5. The computer-readable medium of claim 2, wherein using the shape-based identification and applying the targeted correction form part of a concurrent processing algorithm for a plurality of layout imperfections.

6. The computer-readable medium of claim 1, wherein applying the targeted correction includes applying an adaptive correction.

7. The computer-readable medium of claim 6, wherein applying the adaptive correction includes performing an operation that is a function of an existing layout parameter associated with the layout imperfection.

8. The computer-readable medium of claim 7, wherein applying the targeted correction further includes loading instructions from across a network.

9. The computer-readable medium of claim 6, wherein using the shape-based identification and applying the targeted correction form part of a sequential processing algorithm for a plurality of layout imperfections.

10. The computer-readable medium of claim 6, wherein using the shape-based identification and applying the targeted correction form part of a concurrent processing algorithm.

11. The computer-readable medium of claim 1, wherein applying the targeted correction includes applying a replacement correction.

12. The computer-readable medium of claim 11, wherein applying the replacement correction includes performing an operation that replaces the layout imperfection.

13. The computer-readable medium of claim 12, wherein applying the targeted correction further includes loading instructions from across a network.

14. The computer-readable medium of claim 11, wherein using the shape-based identification and applying the targeted correction form part of a sequential processing algorithm for a plurality of layout imperfections.

15. The computer-readable medium of claim 11, wherein using the shape-based identification and applying the targeted correction form part of a concurrent processing algorithm for a plurality of layout imperfections.

* * * * *